United States Patent
Miyano et al.

(10) Patent No.: US 7,602,013 B2
(45) Date of Patent: Oct. 13, 2009

(54) SEMICONDUCTOR DEVICE WITH RECESSED CHANNEL

(75) Inventors: Kiyotaka Miyano, Tokyo (JP); Ichiro Mizushima, Yokohama (JP); Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 11/649,752

(22) Filed: Jan. 5, 2007

(65) Prior Publication Data

US 2007/0238255 A1     Oct. 11, 2007

(30) Foreign Application Priority Data

Apr. 10, 2006   (JP)   ............................ P2006-107385

(51) Int. Cl.
  *H01L 29/78*   (2006.01)
(52) U.S. Cl. ................. 257/328; 257/401; 257/E21.428
(58) Field of Classification Search ................. 257/328, 257/330
  See application file for complete search history.

(56) References Cited

U.S. PATENT DOCUMENTS

| | | | |
|---|---|---|---|
| 6,048,756 A * | 4/2000 | Lee et al. ..................... 438/151 |
| 6,566,734 B2 * | 5/2003 | Sugihara et al. ............. 257/616 |
| 6,879,001 B2 | 4/2005 | Yagishita et al. | |
| 7,041,538 B2 * | 5/2006 | Ieong et al. .................. 438/151 |
| 7,091,069 B2 * | 8/2006 | Doris et al. .................. 438/149 |
| 2003/0211681 A1 * | 11/2003 | Hanafi et al. ................ 438/200 |
| 2004/0124492 A1 | 7/2004 | Matsuo | |
| 2005/0093035 A1 | 5/2005 | Yagishita et al. | |
| 2006/0068553 A1 * | 3/2006 | Thean et al. ................. 438/285 |
| 2007/0138565 A1 * | 6/2007 | Datta et al. .................. 257/369 |

FOREIGN PATENT DOCUMENTS

JP     2003-298060     10/2003

OTHER PUBLICATIONS

English language abstract of CN 1450658 published Oct. 22, 2003.
Matsuo et al., "High Performance Damascene Gate CMOSFETs with Recessed Channel Formed by Plasma Oxidation and Etching Method (RC-POEM)," IEDM Tech. Dig. (2002), pp. 445-448.

* cited by examiner

*Primary Examiner*—Jerome Jackson, Jr.
*Assistant Examiner*—Paul A Budd
(74) *Attorney, Agent, or Firm*—Finnegan, Henderson, Farabow, Garrett & Dunner, L.L.P.

(57) ABSTRACT

A semiconductor device includes: a layer provided on or above a semiconductor substrate, having an opening, and containing Si and Ge; and a gate provided at a position corresponding to the opening. It is possible to provide a semiconductor device and a manufacturing method of the same which realize easy control of a recess amount and reduction in damage at the time of the recessing.

4 Claims, 8 Drawing Sheets

SEMICONDUCTOR DEVICE WITH RECESSED CHANNEL

CROSS-REFERENCE TO THE INVENTION

This application is based upon and claims the benefit of priority from the prior Japanese Patent Application No. 2006-107385, filed on Apr. 10, 2006; the entire contents of which are incorporated herein by reference.

BACKGROUND OF THE INVENTION

1. Field of the Invention

The present invention relates to a semiconductor device, and more particularly, to a semiconductor device having a recessed channel and a manufacturing method of the same.

2. Description of the Related Art

A damascene gate is considered as a highly promising electrode structure of a high-performance MOS transistor. The damascene gate is formed in such a manner that a gate insulation film and a gate electrode are buried in a trace of a removed dummy gate (a mask for use in forming source/drain regions), and is characterized in that a recessed channel can be formed easily therein.

For forming the recessed channel, a channel region is etched so as to be positioned lower than a diffusion layer region. Raising up a diffusion layer in effect makes it possible to reduce a short channel effect (a phenomenon that an absolute value of a threshold value voltage lowers in accordance with the reduction in gate length in a microscopic transistor). There is disclosed an art in which a silicon active layer on a bottom of a gate trench from which a dummy gate has been removed is made thinner by a RIE method or the like, whereby a recessed channel is formed (see JP-A 2003-298060).

SUMMARY OF THE INVENTION

Controlling a recess amount in the recessing by RIE is not necessarily easy. Further, a channel region is likely to suffer damage at the time of the recessing to lower the performance of a semiconductor device.

In view of the above, it is an object of the present invention to provide a semiconductor device and a manufacturing method of the same which realize easy control of a recess amount and reduction in damage at the time of the recessing.

A semiconductor device according to an aspect of the present invention includes: a semiconductor substrate; a first layer provided on or above the semiconductor substrate, having an opening or a recession, and containing Si and Ge; a gate insulation film provided at a position corresponding to the opening or the recession; and a gate electrode provided on the gate insulation film.

A manufacturing method of a semiconductor device according to another aspect of the present invention includes: forming a first layer containing Si and Ge on or above a semiconductor substrate; forming a dummy gate on the formed first layer; introducing an impurity to the semiconductor substrate to form an impurity diffusion layer, with the formed dummy gate serving as a mask; forming a second layer which covers the first layer and from which at least part of a top of the dummy gate is exposed; removing the dummy gate to form a gate trench having a bottom on which the first layer is provided; and etching the first layer provided on the bottom of the gate trench by an etching solution.

DESCRIPTION OF THE EMBODIMENTS

Hereinafter, embodiments of the present invention will be described in detail with reference to the drawings.

First Embodiment

Figure 1:
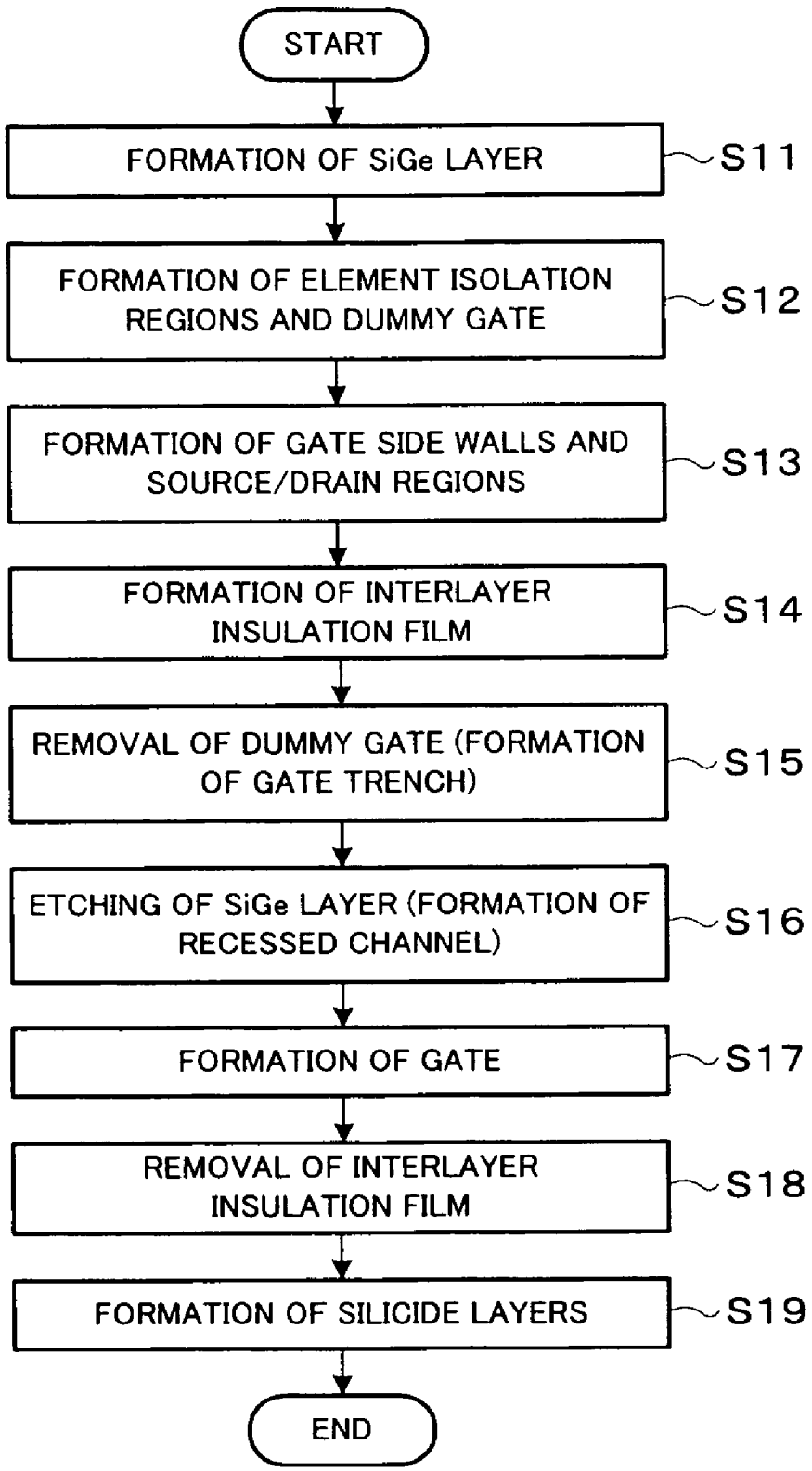
FIG. 1 is a flowchart showing a manufacturing method of a semiconductor device according to a first embodiment of the present invention.

FIG. 1 is a flowchart showing a manufacturing method of a semiconductor device according to a first embodiment of the present invention. FIG. 2 to FIG. 10 are cross sectional views showing a semiconductor device manufactured by the manufacturing method shown in FIG. 1. Here, a MOS field-effect transistor (MOS-FET) is taken as an example of the semiconductor device, and a manufacturing method thereof is shown.

Figure 2:
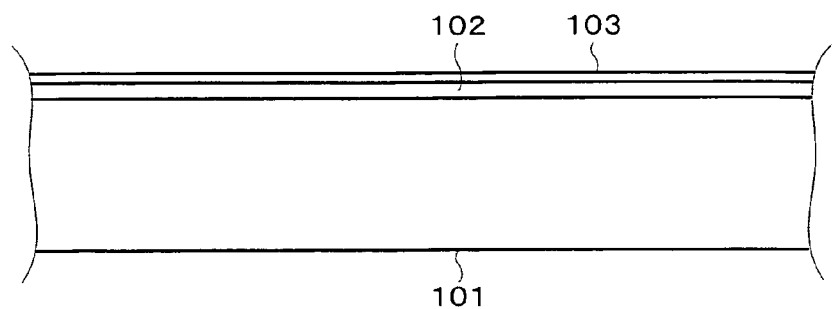
FIG. 2 to FIG. 10 are cross-sectional views showing a semiconductor device manufactured by the manufacturing method shown in FIG. 1.

(1) Formation of SiGe Layer (Step S11 and FIG. 2)

1) After a natural oxide film on a surface of a semiconductor substrate 101 made of, for example, Si is removed by, for example, a dilute hydrofluoric acid solution, a SiGe layer 102 is formed. For example, the SiGe layer 102 with a thickness of about 4 nm is formed by CVD (Chemical Vapor Deposition). Generally, the SiGe layer 102 becomes an epitaxially grown layer reflecting crystallinity of the base semiconductor substrate 101.

The SiGe layer 102 is etched later and used for forming a later-described recessed channel. That is, the SiGe layer 102 is a kind of a sacrificial layer and is formed to an appropriate thickness according to the depth (hereinafter referred to as "a recess amount") of a recession of a channel region.

The composition ratio of Si and Ge in the formed SiGe layer 102 is appropriately adjustable, and the composition ratio of Ge can be in a range from 10 at % to 100 at %, for example, 25 at %. The etching speed depends on the composition ratio. When a later-described etching solution (NC2) containing choline is used, the etching speed becomes higher as the composition ratio of Ge is higher.

2) A Si layer 103 is formed on the SiGe layer 102. For example, the Si layer 103 with a thickness of about 3 nm is formed by a CVD method. That is, the SiGe layer 102 and the Si layer 103 are formed successively. Since the SiGe layer 102 which is the lower layer is the epitaxially grown layer, the Si layer 103 becomes an epitaxially grown layer reflecting the crystallinity of the semiconductor substrate 101.

The Si layer 103 is oxidized later and used for forming a dummy gate. That is, the formation of the Si layer 103 can be considered as part of a later process of forming the dummy gate (Step S12).

Figure 3:
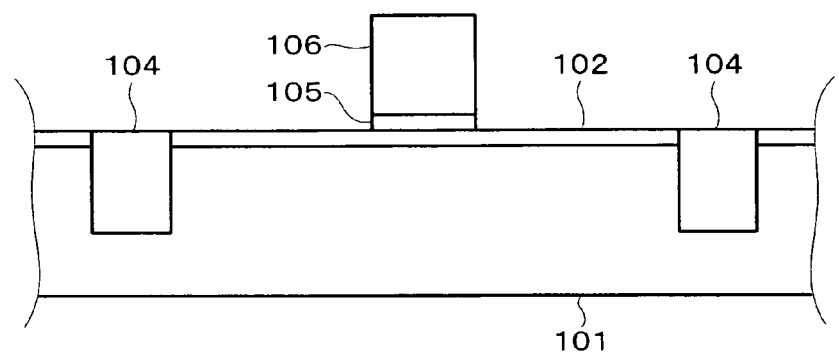

(2) Formation of Element Isolation Regions and Dummy Gate (Step S12 and FIG. 3)

1) Shallow trenches are formed on the surface of the semiconductor substrate 101 and the trenches are filled with an oxide film 104. That is, element isolation regions defining a formation region of the MOS transistor are formed (STI (Shallow Trench Isolation)). The thickness of the oxide film 104 (the depth of the trenches) is, for example, about 400 nm.

2) The dummy gate is formed. The dummy gate functions as a mask for use in forming extension regions 107 and is removed thereafter. Concretely, the dummy gate has a two-layer structure of a gate insulation film 105 and a gate electrode 106 and can be formed by the following processes.

An oxide film for the gate insulation film 105 and a polysilicon film for the gate electrode 106 are sequentially formed. Concretely, the Si layer 103 is oxidized, whereby the oxide film is formed, and the polysilicon film is formed by CVD. These oxide film and polysilicon film are processed into a gate, whereby the dummy gate (the gate insulation film 105 and the gate electrode 106) is formed.

Desirably, the gate insulation film 105 is formed to a thickness so that the Si layer 103 is consumed substantially completely. That is, the gate insulation film 105 is desirably formed by entirely oxidizing the Si layer 103. For example, the Si layer 103 of 3 nm is entirely oxidized, whereby the gate insulation film 105 with a thickness of about 6 nm is obtained. Preferably, substantially no Si layer 103 is left in order to facilitate a later process of removing the dummy gate.

The gate insulation film 105 functions as an etching stopper when the gate electrode 106 (polysilicon film) is removed by etching. Therefore, the thickness of the gate insulation film 105 is set to a thickness appropriate for the etching stopper, for example, about 6 nm. Giving some degree of thickness to the gate insulation film 105 facilitates removing the gate electrode 106.

A gate insulation film for a MOS-FET is required to have an extremely small thickness such as about 1.0 nm. However, being only a dummy (structure only temporarily existing in the course of the manufacturing processes and removed later), the gate insulation film 105 need not be so extremely thin.

Figure 4:
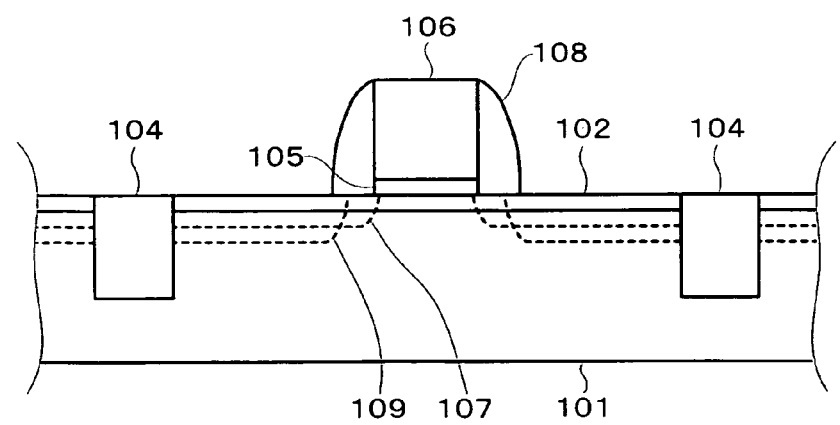

(3) Formation of Gate Sidewalls and Source/Drain Regions (Step S13 and FIG. 4)

Gate sidewalls (gate sidewall insulation films 108), source/drain regions (extension regions 107 and contact junction regions 109) are formed on the semiconductor substrate 101. The gate sidewalls and the source/drain regions are formed by the following processes.

1) Ions are implanted to the semiconductor substrate 101 with the dummy gate serving as a mask, whereby the extension regions 107 are formed. The extension regions 107 are shallow portions in the source/drain regions. If the semiconductor substrate 101 is of n-type, the formed extension regions 10 are of p-type. If the semiconductor substrate 101 is of p-type, the formed extension regions 107 are of n-type. That is, the formed MOS-FET can be of p-type or n-type as required.

After the ion implantation, the semiconductor substrate 101 is heat-treated. This is for recovering the crystallinity that has been broken by the ion implantation. About 800° C. is high enough as the temperature for the heat treatment at this time. The depth of the resultant extension regions 107 is, for example, 10 nm or less.

Note that offset spacers may be formed on the sidewalls of the dummy gate prior to the formation of the extension regions 107. The offset spacers function as a mask at the time of the ion implantation. Adjusting the thickness of the offset spacers makes it possible to control the formation positions of the extension regions 107.

2) The gate sidewall insulation films 108 are formed. For example, a silicon nitride film, a silicon oxide film, or the like is formed and etched, whereby the gate sidewall insulation films 108 are formed on side faces of the gate electrode 106.

3) Ions are implanted to the semiconductor substrate 101 with the dummy gate and the gate sidewall insulation films 108 serving as a mask, whereby the contact junction regions 109 are formed. The contact junction regions 109 are deep junction portions in the source/drain regions.

Figure 5:
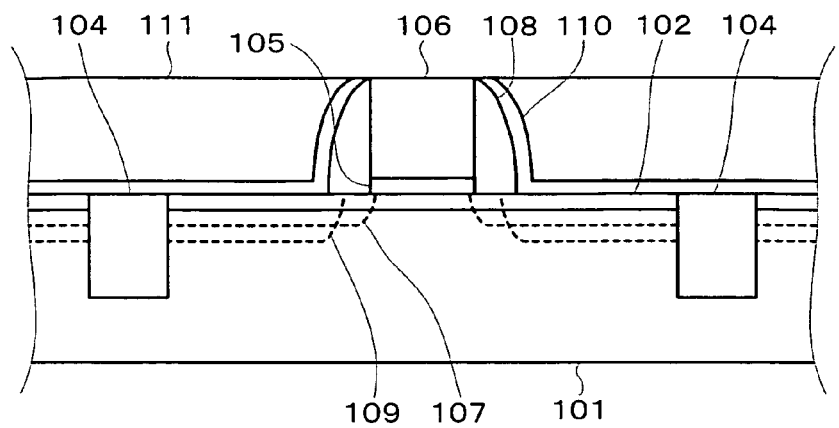

(4) Formation of Interlayer Insulation Film (Step S14 and FIG. 5)

An interlayer insulation film is formed on the gate insulation film 105. An example usable as the interlayer insulation film is a film stack of a liner silicon nitride film (SiN) 110 and a silicon oxide film (SiO$_2$) 111. The liner silicon nitride film 110 is used as an etching stopper at the time of the later process of removing the dummy gate.

Concretely, the interlayer insulating film can be formed by the following processes. That is, the liner silicon nitride film 110 and the silicon oxide film 111 are sequentially deposited. Thereafter, the interlayer insulation film is smoothed by a CMP (Chemical Mechanical Polishing) method or the like. That is, the liner silicon nitride film 110 and the silicon oxide film 111 are polished until the gate electrode 106 is exposed.

Figure 6:
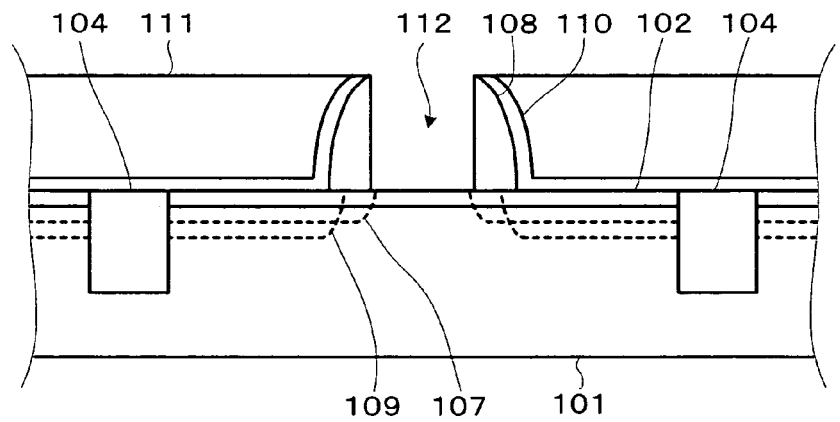

(5) Removal of Dummy Gate (Formation of Gate Trench) (Step S15 and FIG. 6)

The dummy gate (the gate electrode 106 and the gate insulation film 105) is removed, whereby a gate trench is formed.

First, the dummy gate electrode 106 exposed from the interlayer insulation film is selectively removed. An example of a method for this removal is an etching method using plasma. Subsequently, the dummy gate insulation film 105 is removed by using dilute hydrofluoric acid or the like.

As a result of the removal of the dummy gate, a surface of the channel region of the semiconductor substrate 101 is exposed. As a result, in the interlayer insulation film (the liner silicon nitride film 110 and the silicon oxide film 111), a gate opening trench 112 (gate trench) is formed as a trace of the removed gate electrode 106 and gate insulation film 105.

Figure 7:
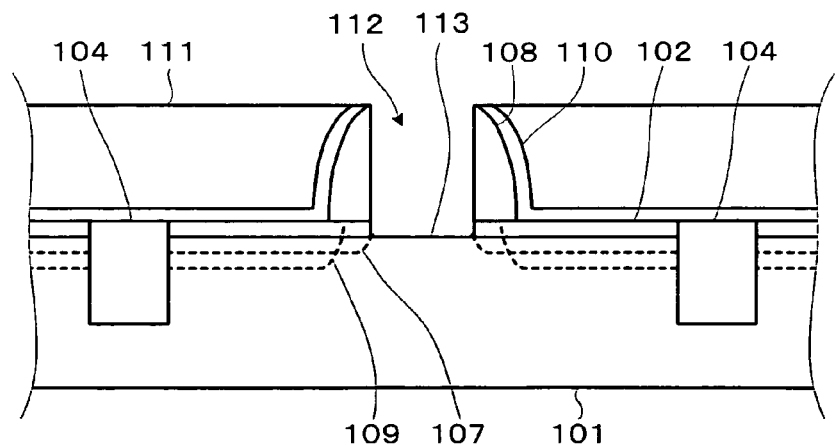

(6) Etching of SiGe Layer (Formation of Recessed Channel) (Step S16 and FIG. 7)

The SiGe layer 102 is etched, whereby a recessed channel 113 is formed. Specifically, the surface of the channel region exposed from a bottom of the gate opening trench 112 is removed by using an etching solution. The surface of the channel region is a channel region of the SiGe layer 102 previously formed. As a result of the etching of the SiGe layer 102, the surface of the channel region sinks, so that the recessed channel 113 is formed. At this time, a recess amount is equal to the thickness of the SiGe layer 102, for example, about 6 nm. As a result, in the SiGe layer 102, an opening is formed at a position corresponding to the gate opening trench 112.

As an etching solution, usable is a mixed solution (aqueous solution) of choline (2-hydroxyethyl trimethylammonium hydroxide ([HOCH$_2$CH$_2$N(CH$_3$)$_3$]$^+$OH$^-$)), hydrogenperoxide (H$_2$O$_2$), and water. By this etching solution, the SiGe layer 102 is easily etched. A constituent material (for example, Si) of the semiconductor substrate 101 is hardly soluble in this etching solution. By utilizing this etching selectivity, it is possible to selectively etch only the surface of the channel region exposed from the bottom of the gate opening trench 112. At this time, the etching solution is kept at low temperature of 100° C. or lower, for example, at about 70° C.

Figure 8:
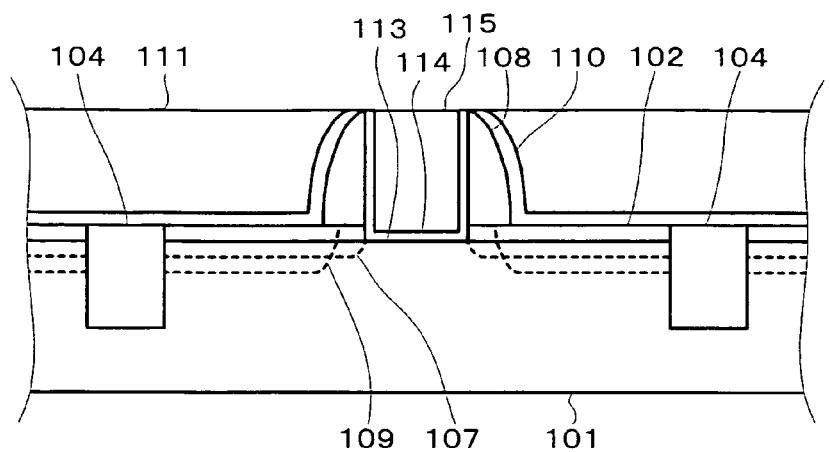

(7) Formation of Gate (Step S17 and FIG. 8)

A gate (a gate insulation film 114 and a gate electrode 115) is formed as follows, for instance. The gate is a damascene gate buried in the gate opening trench 112.

1) The gate insulation film 114 is formed in the gate opening trench 112.

An example of the gate insulation film 114 is a silicon oxynitride film. By plasma-oxidizing the surface of the SiGe layer 102, an oxide film of about 1.0 nm is formed, and a surface of this oxide film is nitrided by plasma nitridation, whereby the silicon oxynitride film as the gate insulation film 114 is formed.

For the gate insulation film 114, also usable is a high-dielectric material such as HfSiON.

2) A gate electrode material is buried in the gate opening trench 112, whereby the gate electrode 115 is formed.

This burial can be realized by, for example, forming the gate electrode material with good covering property on the whole surface of the semiconductor substrate 101 and planarizing this film by CMP or the like. An example of the constituent material of the gate electrode 115 is polysilicon. As the constituent material of the gate electrode 115, also usable is metal such as W, Ni, Co, or Mo, an alloy thereof, a mixture of Si and Ge, or the like.

In a case where the constituent material of the gate electrode 115 is polysilicon, ion implantation and heat treatment are performed. Specifically, impurity ions such as arsenic (As), phosphorus (P), and boron (B) are implanted to the gate electrode 115. Thereafter, in order to activate the impurities implanted to the gate electrode 115, activation heat treatment is applied for a short time at 1000° C. or higher.

Figure 9:
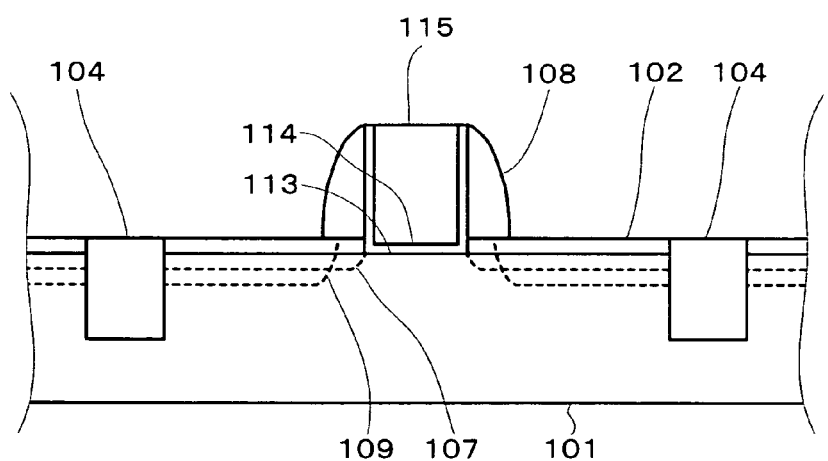

(8) Removal of Interlayer Insulation Film (Step S18 and FIG. 9)

The interlayer insulation film (the liner silicon nitride film 110 and the silicon oxide film 111) is removed. The silicon oxide film 111 is selectively removed by using, for example, hydrofluoric acid. Subsequently, the liner SiN film 110 is anisotropically etched by using anisotropic etching such as RIE (Reactive Ion Etching). As a result, surfaces of the contact junction regions 109 (surface of the SiGe layer 102) are exposed.

Figure 10:
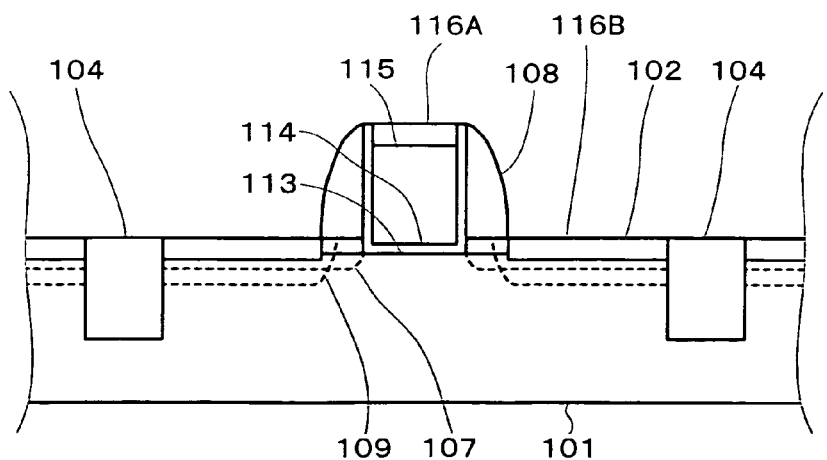

(9) Formation of Silicide Layers (Step S19 and FIG. 10)

Silicide layers 116A, 116B are formed on upper surfaces of the gate electrode 115 and the contact junction regions 109. Si elements are exposed on the upper surface of the gate electrode 115 and the upper surfaces of the contact junction regions 109. Co, Ni, or the like is caused to react with the exposed Si, whereby the silicide layers 116A, 116B are selectively formed (SALICIDE: Self Aligned Silicide). Then, after the formation of contacts, wiring, and so on, the MOS-FET is formed.

As described above, in this embodiment, by using the semiconductor substrate 101 on which the layer containing Si and Ge (the SiGe layer 102) is stacked, the damascene gate having the recessed channel 113 is formed. Concretely, the dummy gate, the source/drain regions, and the interlayer insulation film are formed, and after the removal of the dummy gate, the SiGe layer 102 is selectively etched by the etching solution in which choline, hydrogen peroxide, and water are mixed, whereby the recessed channel 113 is formed.

The manufacturing method of the semiconductor device according to this embodiment has the following advantages.

(1) The recess amount can be easily controlled. The reason why the recess amount is easily controlled is that the recess amount is determined by the thickness of the SiGe layer 102. Specifically, the recessing is done by the selective etching of SiGe and therefore, the recess amount can be controlled by the thickness of the previously formed SiGe Layer 102.

(2) Damage to the channel region and so on due to the recessing is small. The channel region is recessed by wet etching using an etching solution.

1) The temperature at the time of this wet etching is lower than the temperature in a method using thermal oxidation or the like. Accordingly, impurity diffusion due to heat is reduced, which makes it possible to maintain a profile of a shallow diffusion layer (the extension regions 107).

2) Further, in this wet etching, the channel region suffers no RIE damage which might occur in a case of RIE. That is, being scarcely etched, the semiconductor substrate 101 (Si) suffers only a small damage.

(3) A highly active diffusion layer using SiGe can be formed. At the time of the ion implantation at Step S13, the SiGe layer 102 becomes part of the diffusion layer. Specifically, ions are diffused to the SiGe layer 102 concurrently with the ion diffusion to the semiconductor substrate 101, which enables the formation of the highly active diffusion layer using SiGe.

(4) Mobility of electrons can be improved. By applying stress to the channel region, it is possible to form the MOS-FET with improved mobility of electrons. By forming the SiGe layer 102 on diffusion layer regions (the extension regions 107 and the contact junction regions 109), stress (compressive strain) is applied to the channel region. On the other hand, the SiGe layer 102 has been removed on the channel region, so that no stress resisting the compressive strain occurs on the channel region. As a result, the stress is effectively applied to the channel region, so that the mobility of the electrons is improved.

(5) The silicide layers are easily formed in the diffusion layer regions. Since the SiGe layer 102 is provided on the diffusion layer regions, the silicide layers 116A, 116B can be easily formed.

(6) Comparison with other methods The following is the comparison of the manufacturing method of the semiconductor device according to this embodiment with other methods.

1) Conceivable methods adopted for forming the recessed channel by using damascene gate technology are as follows.

After the removal of a dummy gate, a channel region to be recessed is thermally oxidized and the resultant oxide film is removed by wet etching.

After the removal of a dummy gate, a channel region to be recessed is removed by RIE.

However, as for the former method, it is difficult to maintain a shallow junction profile (the extension regions 107) since impurities diffuse at the time of the thermal oxidation. As for the latter method, since a recess amount is controlled by the processing time of RIE, accurate control thereof is difficult. Further, the channel region suffers damage due to RIE, which is likely to cause trouble or performance deterioration of a semiconductor device (for example, gate leakage and lowered channel mobility)

2) Methods not using the damascene gate technology include methods called elevated source/drain and raised source/drain. In these methods, a diffusion layer is raised by selective epitaxial growth, which can realize substantially the same structure as the recessed channel.

However, deposition only on the diffusion layer is difficult. Specifically, due to variation in deposition conditions, there is a possibility that Si is deposited not only on Si (diffusion layer) but also on an insulation film. At this time, insulation is impaired in element isolation regions and the like, which may possibly cause a malfunction of a semiconductor device.

A CVD method is generally used for this selective growth. The CVD method is a high-temperature process at, for example, about 800° C., so that impurities introduced by ion implantation or the like diffuse, which makes it difficult to maintain a shallow junction profile. In addition, this method uses a plurality of gas species such as, for example, $SiH_2Cl_2$, HCl, and $H_2$, and thus is cost-disadvantageous.

3) Compared with the above methods, the manufacturing method of the semiconductor device according to this embodiment enables easy control at the time of the formation of the recessed channel and causes only a small damage at the time of the recessing. In addition, this method is cost-advantageous.

Second Embodiment

Figure 11:
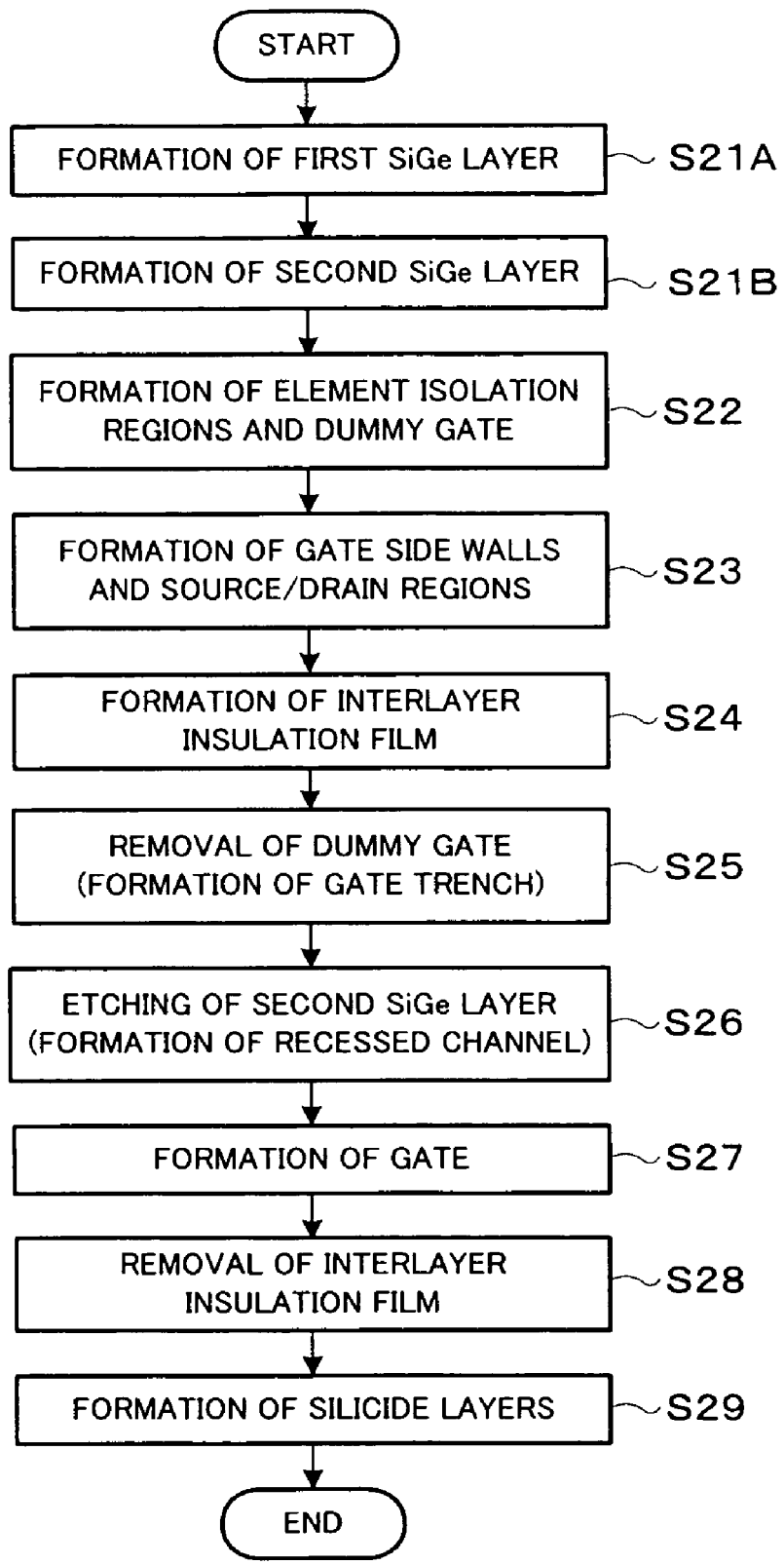
FIG. 11 is a flowchart showing a manufacturing method of a semiconductor device according to a second embodiment of the present invention.
Figure 12:
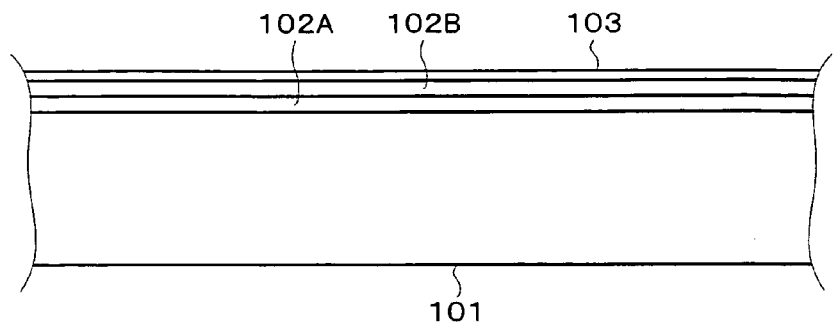
FIG. 12 to FIG. 20 are cross-sectional views showing a semiconductor device manufactured by the manufacturing method shown in FIG. 11.
Figure 13:
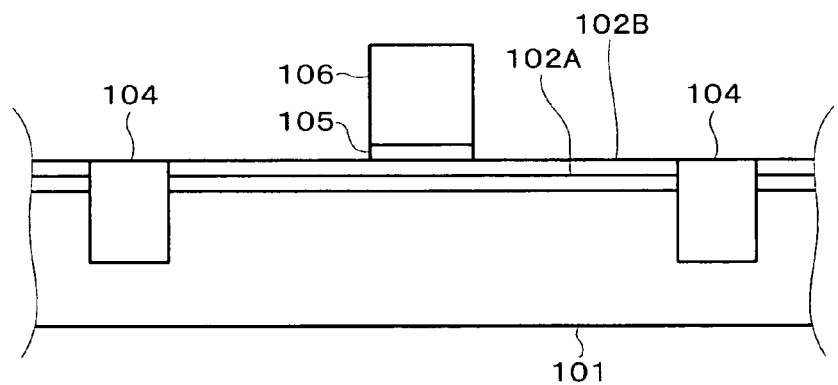
Figure 14:
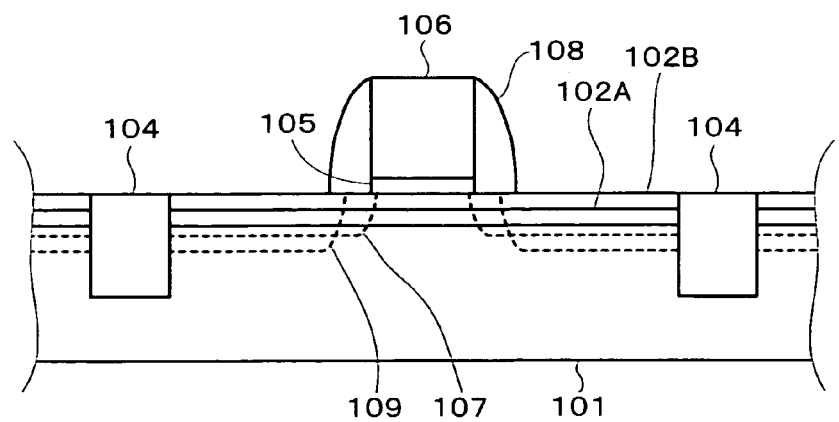
Figure 15:
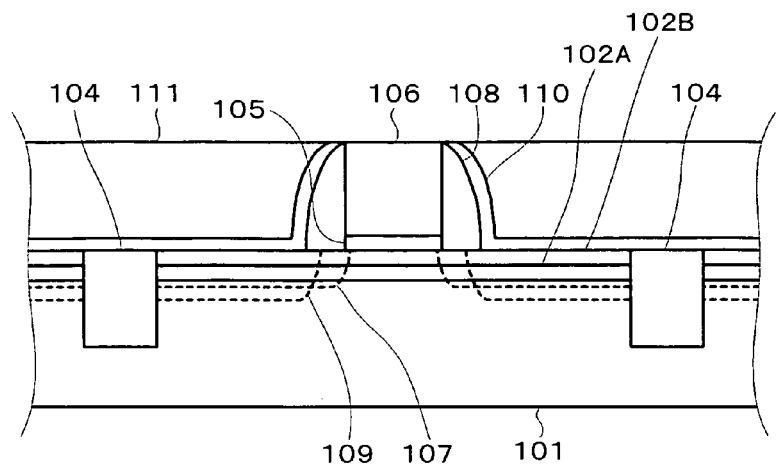
Figure 16:
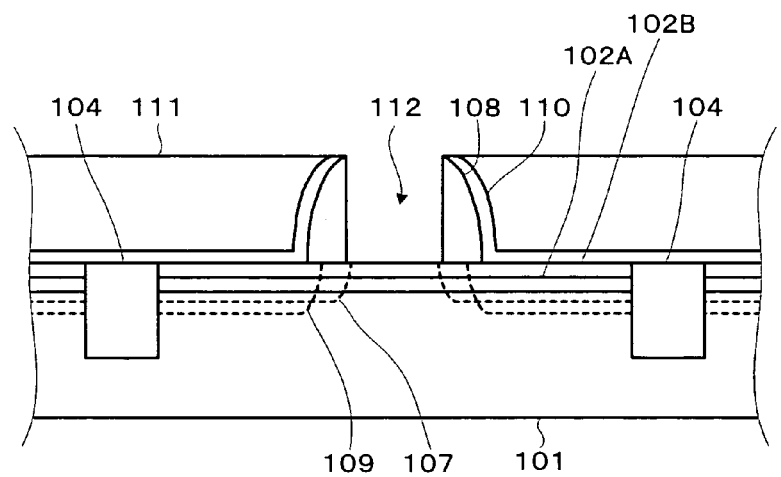

FIG. 11 is a flowchart showing a manufacturing method of a semiconductor device according to a second embodiment of the present invention. FIG. 12 to FIG. 20 are cross-sectional views showing a semiconductor device manufactured by the manufacturing method shown in FIG. 11.

Figure 17:
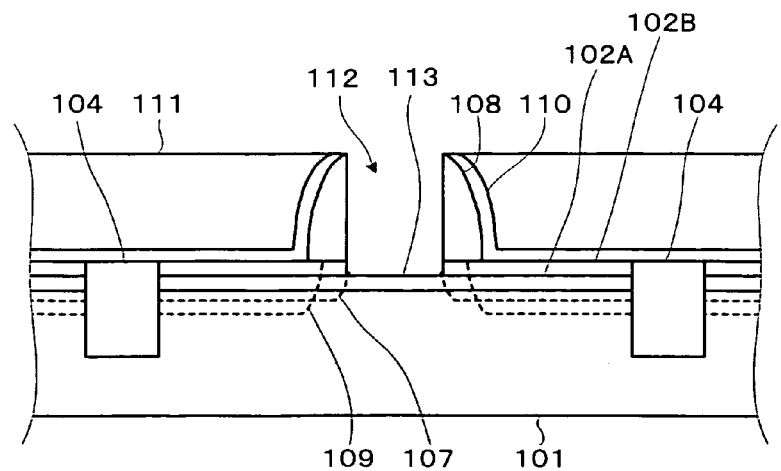
Figure 18:
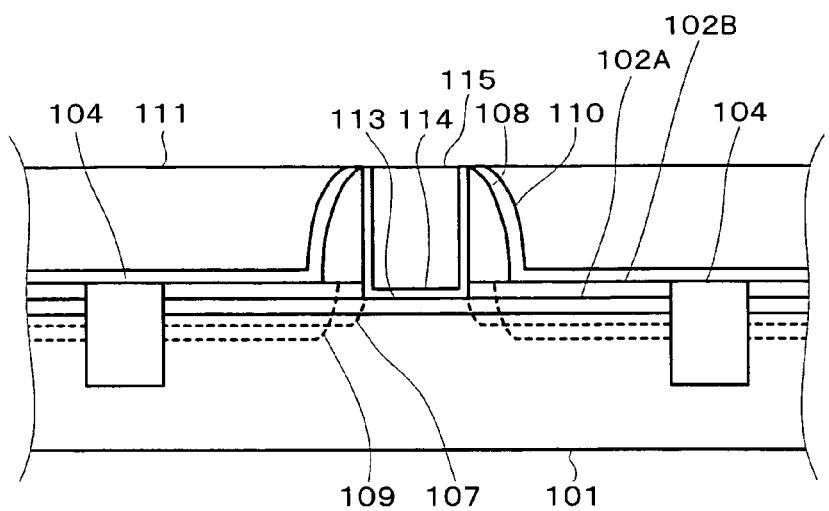
Figure 19:
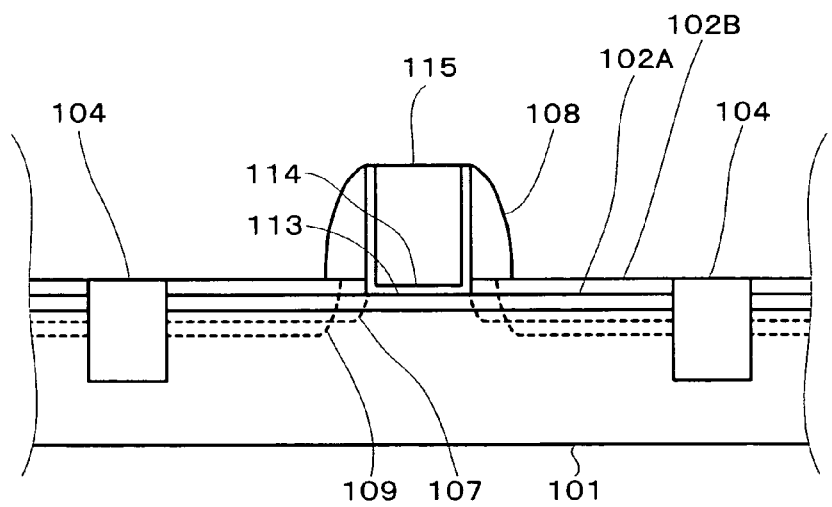
Figure 20:
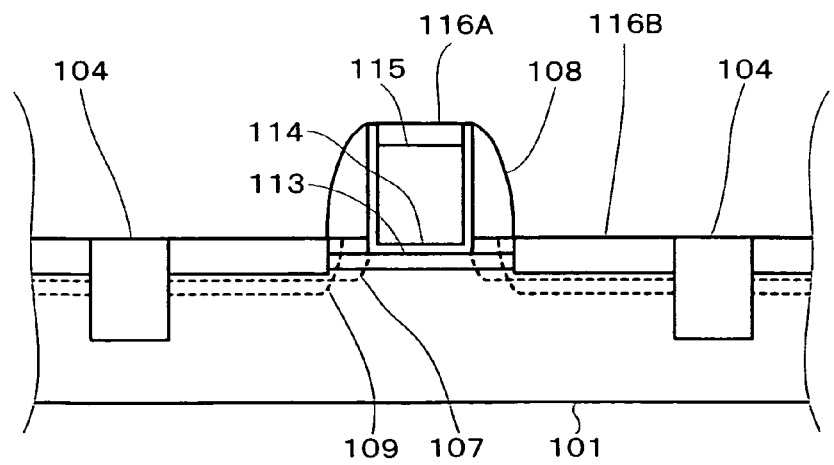

In the manufacturing method of the semiconductor device according to this embodiment, a first and a second SiGe layer 102A, 102B are stacked (Steps S21A, S22B, and FIG. 12) and the second SiGe layer 102B is etched, whereby a recessed channel 113 is formed (Step S26 and FIG. 17). An opening is formed in the second SiGe layer 102B at a position corresponding to a bottom of a gate opening trench 112. Note that the first SiGe layer 102A left unetched can be used as a channel.

At this time, the composition ratio of Ge in the first SiGe layer 102A is made different from that in the second SiGe layer 102B. This is intended for giving different etching properties to these layers to thereby enable selective etching of the second SiGe layer 102B. Concretely, the composition ratio of Ge in the second SiGe layer 102B is made larger than the composition ratio of Ge in the first SiGe layer 102A. This makes it possible to make the etching speed of the second SiGe layer 102B higher than the etching speed of the first SiGe layer 102A in etching using an etching solution in which choline, hydrogen peroxide, and water are mixed.

As an example, the first SiGe layer 102A is composed as $Si_{77}Ge_{23}$ and the second SiGe layer 102B is composed as $Si_{37}Ge_{63}$. Such compositions enable selective etching of the second SiGe layer 102B by an etching solution with the composition of choline:$H_2O_2$:$H_2O$=1:1:6 or 1:2:35.

In the above-described manner, a damascene gate having the recessed channel 113 is formed by using a semiconductor substrate 101 on which the first and second layers containing Si and Ge (the first and second SiGe layers 102A, 102B) are stacked. Concretely, a dummy gate, source/drain regions, and an interlayer insulation film are formed, and after the removal of the dummy gate, the second SiGe layer 102B is selectively etched by the aforesaid etching solution, whereby the recessed channel 113 is formed.

The manufacturing method of the semiconductor device according to this embodiment has substantially the same advantages as the advantages (1) to (6) of the manufacturing method of the semiconductor device according to the first embodiment, as follows.

(1) A recess amount can be easily controlled.
(2) A channel region and the like suffer only a small damage by the recessing.
(3) A highly active diffusion layer using SiGe can be formed.
(4) Mobility of electrons can be improved.

By applying stress to the channel region, a MOS-FET with improved mobility of electrons can be formed. In this embodiment, the SiGe layer 102A is formed on the channel region. However, the thickness of the SiGe layer 102A on the channel region is smaller than the total thickness of the SiGe layers 102A, 102B on diffusion layer regions. As a result, it is possible to effectively apply stress to the channel region.

(5) Silicide layers can be easily formed in the diffusion layer regions.

Since the SiGe layer 102B with a relatively high concentration is provided on the diffusion layer regions, the silicide layers 116A, 116B can be formed easily.

(6) Compared with other methods, the control at the time of forming the recessed channel is easier and a damage at the time of the recessing is smaller. In addition, this method is cost-advantageous.

The manufacturing method of the semiconductor device according to this embodiment has the following advantage in addition to the above advantages (1) to (6).

(7) The SiGe layer can be utilized as the channel.

Making the Ge composition different between the first and second SiGe layers 102A, 102B makes it possible to realize a high selective ratio and enables the utilization of the first SiGe layer 102A as a SiGe channel. Specifically, if the second SiGe layer 102B has a higher Ge composition, it is possible to etch only the second SiGe layer 102B and leave the first SiGe layer 102A as the SiGe channel. The co-use of the recessed channel and the SiGe channel is enabled.

Other Embodiments

Embodiments of the present invention are not limited to the contents described in the foregoing embodiments, and these embodiments can be expanded and changed. The expanded and changed embodiments are also included in the technical scope of the present invention.

For example, the number of the SiGe layers is not limited to two but may be three or more. Further, the composition ratio of SiGe may be gradually changed in the layer.

In the embodiments described above, the mixed solution containing choline is used as the etching solution of the SiGe layer. As the etching solution, usable is an alkali solution excluding choline or a mixed solution of hydrogen peroxide and water. Further, a mixed solution of hydrofluoric acid (HF), nitric acid ($HNO_3$), and water is also usable as the etching solution.

What is claimed is:

1. A semiconductor device, comprising:
a semiconductor substrate consisting of silicon (Si);
a first layer provided on or above said semiconductor substrate, having an opening, and containing silicon (Si) and germanium (Ge);
a channel region provided in the semiconductor substrate at a position corresponding to the opening, the channel region consisting of silicon (Si);
a gate insulation film provided at the position corresponding to the opening;
a gate electrode provided on said gate insulation film; and
a gate sidewall insulation film formed on the first layer.

2. The semiconductor device as set forth in claim 1, wherein said first layer has an impurity diffusion region.

3. The semiconductor device as set forth in claim 1, wherein said first layer has a silicide region.

4. The semiconductor device as set forth in claim 1, wherein the opening is configured to form a through hole of the first layer.

* * * * *